United States Patent [19]

Katayama et al.

[11] Patent Number: 4,796,068

[45] Date of Patent: Jan. 3, 1989

[54] SEMICONDUCTOR DEVICE HAVING ULTRAHIGH-MOBILITY

[75] Inventors: Yoshifumi Katayama, Tokorozawa; Yasuhiro Shiraki, Hino; Yoshimasa Murayama, Koganei, all of Japan

[73] Assignee: Hitachi, Ltd., Tokyo, Japan

[21] Appl. No.: 40,123

[22] Filed: Apr. 20, 1987

[30] Foreign Application Priority Data

Apr. 21, 1986 [JP] Japan ................... 61-89961

[51] Int. Cl.[4] ................ H01L 29/161; H01L /27/12
[52] U.S. Cl. .......................... 357/4; 357/16
[58] Field of Search ................... 357/4 SL, 16

[56] References Cited

U.S. PATENT DOCUMENTS 3,882,533 5/1975 Dohler ................... 357/58
4,654,090 3/1977 Burnham ................ 357/4 SL

FOREIGN PATENT DOCUMENTS 0212295 4/1987 European Pat. Off.
60-9174 1/1985 Japan.
2157492A 10/1985 United Kingdom.

OTHER PUBLICATIONS

Patent Abstracts of Japan, vol. 10, No. 99, Apr. 16, 1986.
IBM Tech. Disel Bull., vol. 27, No. 4B, Sep. 1984, pp. 2582-2593.
Appl. Phys. Lett. vol. 47, No. 12, Dec. 15, 1985, pp. 1324-1326.
Proceed. 1985 Int. Electron Device Mee't., Dec. 1-4, 1985, pp. 558-561.
Fowler et al, I.B.M. Tech. Discl. Bull., vol. 12, No. 12, May 1970.

Primary Examiner—Martin H. Edlow
Attorney, Agent, or Firm—Antonelli, Terry & Wands

[57] ABSTRACT

A semiconductor device which utilizes the fact that the effective mass of charged particles becomes exceedingly large at certain points in the direction of a periodically repeating potential by virtue of a periodic structure in which semiconductor layers are stacked in the form of a superlattice. The periodic structure enables the movement of charged particles to be one-dimensional and thus permits a great improvement in the mobility of charged particles in the channel direction. Accordingly, it is possible to realize a FET of ultrahigh mobility.

31 Claims, 6 Drawing Sheets

SEMICONDUCTOR DEVICE HAVING ULTRAHIGH-MOBILITY

BACKGROUND OF THE INVENTION

The present invention relates to a semiconductor device and, more particularly, to a semiconductor device which is operable at ultrahigh frequency.

An ultrahigh-mobility FET having an aperating range which exceeds conventional field effect transistors (hereinafter abbreviated as FET) has already been proposed by H. Sakaki et al. and discussed in Japanese Journal of Applied Physics Vol. 19 (1980), p.94. According to their discussion when the width of the channel layer of a MOSFET is sufficiently reduced so that the channel layer meets the conditions of being a quantum well thin line in which electrons which are confined within this channel have freedom to move effectively only in the channel direction, the probability of electrons within the channel being scattered becomes extremely little, so that the mobility of electrons reaches $10^7$ to $10^8$ cm²/ V.s.

However, the device structure proposed by them involves difficulties in producing a device, in which the probability of electrons being scattered at the side surface of the channel is low, with the present microfabrication technology, and therefore it is difficult to realize the proposed device structure.

The following fact has heretofore been known the physical properties of a semiconductor device wherein two kinds of semiconductor layer which are different from each other in terms of electron affinity x are stacked to form a superlattice structure.

Let us consider a structure in which two semiconductor layers 1 and 2 having a different electron affinity x are stacked in the form of a superlattice as shown in FIG. 2A.

Representing the respective electron affinities x and thicknesses of the semiconductor layers 1 and 2 by $x_1$, $x_2$ and a, b, respectively, the effective electrostatic potential felt by conduction electrons within the alternating semiconductor layers is such as that shown in FIG. 2B. More specifically, this potential is a periodic potential having a depth $V_lD = x_1 - x_2$ in the direction of its thickness (the direction of the arrow A). In FIG. 2B, a and b denote the respective thicknesses of the semiconductor layers 1 and 2, while (I) and (II) denote channel and barrier regions, respectively. It is well known, as discussed by R. de L. Kronig and W. G. Penny, that the relationship between the electron energy E and the wave number k of electrons has a structure such as that schematically shown in FIG. 3 (see Proceedings of Royal Society of London, Vol. A130 (1931), R. de L. Kronig and W. G. Penny, p.499).

It will be clear from FIG. 3 that points such as those indicated by A, A', B and B' in the figure are points of inflexion of the E-k curve (the relationship between the wave number k and momentum P is expressed using $h = h/2\pi$, where h is Planck's constant, as follows: $P = nk$). On the other hand, as described in solid state physics textbooks, for example, Handbook of Solid State Physics Vol. 1, C. Kittel (translated by Uno, Tsuya and Yamashita), Maruzen Kabushiki Kaisha, 1981, p.205, the effective mass m* of electrons within a solid body is given by the following equation using the E-k curve:

$$m^*/1 = n^2/1 \, \delta^2 k^2/\delta^2 E$$

It will be understood from the above equation that the effective mass m* of electrons becomes exceedingly large near points of inflexions such as those indicted by A, A', B and B' in FIG. 3 and becomes infinite at these points. More specifically, if the channel layer I and the barrier layer II are alternately and repeatedly stacked to form a periodic structure, the effective mass of electrons increases in the direction of the arrow A in FIG. 2B.

Although the movement of electrons in the direction of thickness of alternating semiconductor layers has been discussed above, it should be noted here that the twodimensional movement of electrons in the direction of plane of the stacked structure is equivalent to that of free electrons.

Although the physical properties of the abovedescribed superlattice semiconductor layers has already been known, the application thereof to semiconductor devices has not yet been realized due to underdevelopment of peripheral technology.

SUMMARY OF THE INVENTION

It is a primary object of the present invention to provide an ultrahigh-mobility FET having a structure in which charged particles within the channel have the freedom to move effectively only in the channel direction.

The present invention makes good use of the fact that, as will be clear from the description of the physical properties of semiconductor layers in the form of a superlattice, in a periodic structure the effective mass of charged particles becomes exceedingly large at certain points in the direction of a periodically repeating potential. More specifically, according to the present invention at least one of the three layers, that is, a semiconductor layer, an insulator layer and a conductor layer, has a periodic structure in which periodic structure elements are periodically disposed in the same direction, the periodic structure being formed so that charge particles have freedom to move effectively only in a direction perpendicular to said direction on the basis of the fact that the effective mass of charged particles related to movement in said direction is relatively large. The above-described periodic structure may be obtained, for example, by forming the layer concerned in the shape of stripes.

The fact that the effective mass of charged particles within a solid body becomes exceedingly large in a certain direction means that it is difficult for the charged particles to be scattered in this direction.

Thus, the present invention provides a method that enables realization of a semiconductor device which makes good use of the phenomenon that it is difficult for charged particles to be scattered in a certain direction and which utilizes the fact that the mobility of charged particles is exceedingly large with respect to an electric field applied in a direction perpendicular to said direction for the same reason as in the case of the quantum well thin line discussed by Sakaki et al.

DETAILED DESCRIPTION OF THE INVENTION

Figure 1A:
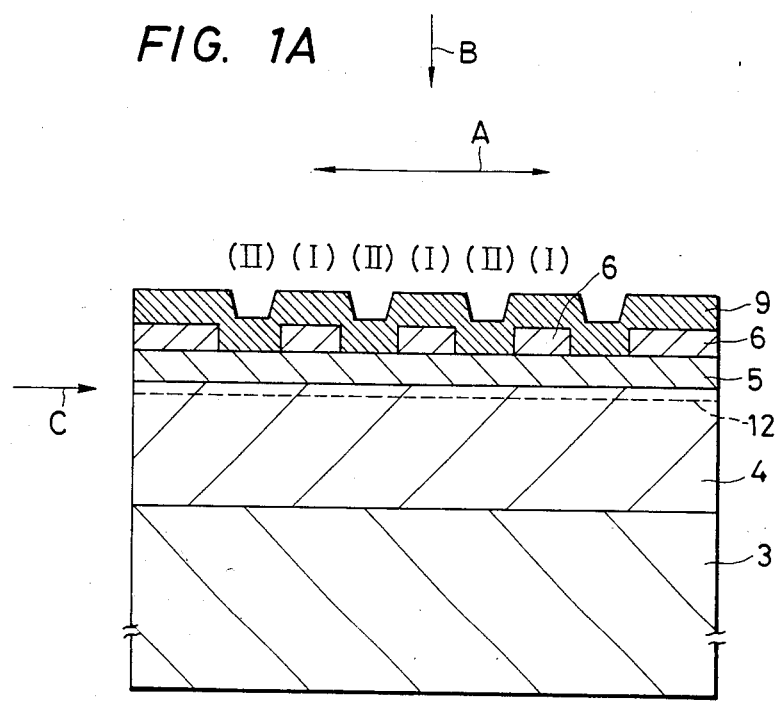
FIG. 1A is a sectional view of a FET in accordance with a first embodiment of the present invention.

A semiconductor device according to the present invention needs to satisfy the following conditions:

(1) the presence of a semiconductor region channel in which a carrier transfer region is generated;

(2) the presence of at least a pair of carrier transmitting and receiving means;

(3) the presence of means for controlling the carrier density;

((1) to (3) are also constituent elements of conventional semiconductor devices; in addition to these requirements, the present invention needs the following factor)

(4) at least one of the three layers constituting the semiconductor device, that is, a semiconductor layer, an insulator layer and a conductor layer, which has a periodic structure in which periodic structure elements are periodically disposed in the same direction.

The above-described periodic structure may be formed in a variety of methods.

In the case where the periodic structure formed in a semiconductor layer, the semiconductor layer is formed from a plurality of stripe regions which are spaced apart from each other in a direction perpendicular to the source-drain direction (i.e., the channel direction), or the semiconductor layer is formed from a plurality of stripe regions which are periodically changed from each other in a direction perpendicular to the channel direction by a known method such as ion implantation. In the case of the former method, the channel is formed in a semiconductor layer located closer to the substrate than the stripe semiconductor layer; in the case of the latter method, the channel is fomed in the portions of the above-described semiconductor layer which are not subjected to ion implantation. Since the conductive portions (i.e., the portions not having been subjected to ion implantation) which define the channel also have a periodic structure, the semiconductor device in this case has two periodic structures which are defined by the semiconductor layer and the conductor layer, respectively.

In the case where the periodic structure is formed in an insulator layer, the insulator layer is formed from thick and thin stripe portions which are alternately disposed in a direction perpendicular to the channel direction.

The carrier transmitting and receiving means are formed at two ends, respectively, of the above-described stripe region, while the carrier density controlling means is disposed on the surface of a layer having the above-described periodic structure.

The period of the periodic structure is preferably set at about 5 nm or more, because, if the period is excessively short, it becomes close to the lattice constant of the crystal so that carriers will not behave as described in the aforementioned theory and the limit of microfabrication is exceeded. On the other hand, if the period is excessively long, carriers will not behave as described in said theory in relation to the de Broglie wavelength; therefore, the period is preferably set at 500 nm or less. Within the above-described period range, it is necessary to make the period shorter in the case of using a silicon semiconductor than in the case of using compound semiconductors.

The thickness of each of the semiconductor and insulator layers which constitute a semiconductor device is generally selected from the viewpoint of design. However, when a periodic structure is defined by a semiconductor layer consisting of a plurality of stripe semiconductor regions, there is a certain range concerning the thickness of the stripe semiconductor layer and a semiconductor layer which is disposed below it (i.e., closer to the substrate) to supply carriers. If these layers are excessively thick, the effect of the present invention cannot reach the carrier transfer region, whereas, when the layers are excessively thin, 2-dimensional-electron gas is not sufficiently generated. A preferable thickness range for each of the layers is 10 to 100 nm, more preferably 30 to 50 nm. In the case of formation of a periodic structure using an insulator also, the thickness of the insulator layer is limited for the reasons similar to the above and is preferably selected so as to fall in a range from 10 to 100 nm.

Embodiments 1 to 4 of the present invention will be described hereinunder with reference to the accompanying drawings. Embodiment 1:

In this embodiment, a period structure is defined by a semiconductor layer and stripe-shaped semiconductor layers are spaced apart from each other in a direction perpendicular to the channel direction.

Figure 1B:
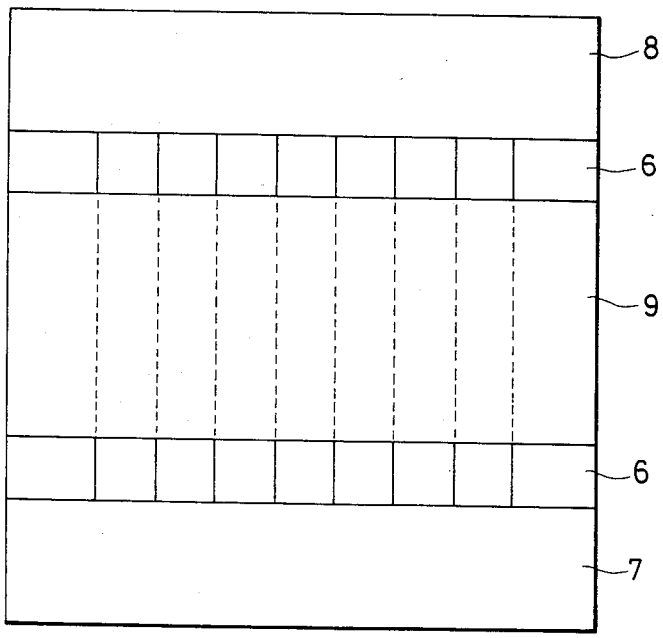
FIG. 1B is a plan view of the FET shown in FIG. 1A.

FIG. 1A is a sectional view of a FET in accordance with a first embodiment of the present invention, and FIG. 1B is a plan view of the FET shown in FIG. 1A (as viewed in the direction of the arrow B in FIG. 1A). A cross-section of the FET as viewed in the direction of the arrow C in FIG. 1A is shown in FIG. 6.

Figure 2A:
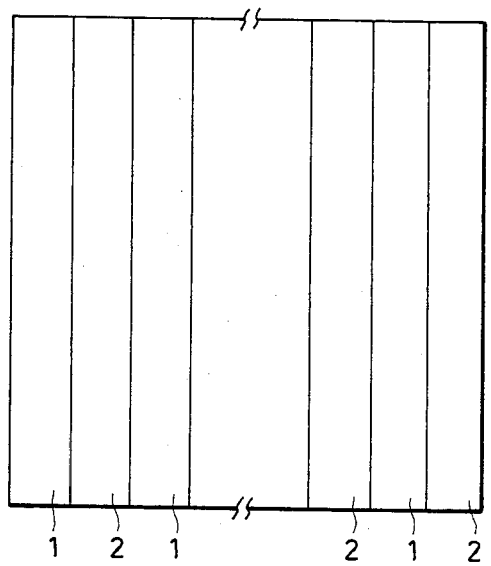
FIG. 2A schematically shows semiconductor layers grown in the form of a superlattice for describing the physical properties of superlattice semiconductor layers.
Figure 2B:
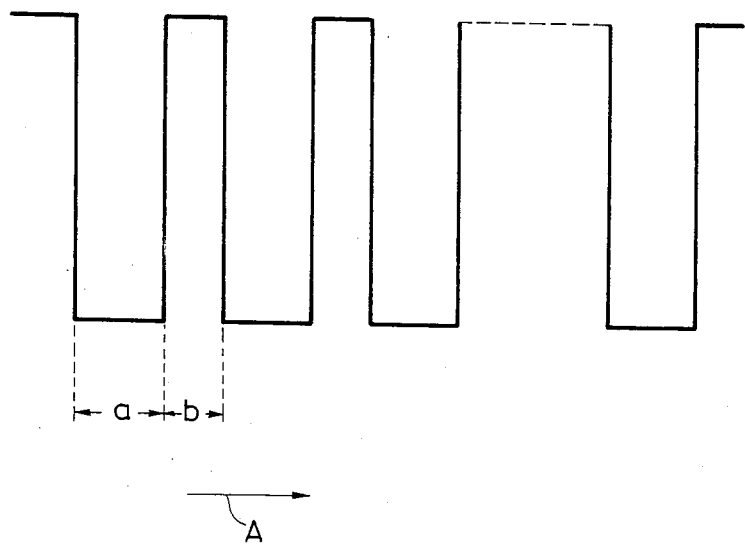
FIG. 2B schematically shows the potential of the superlattice semiconductor layers illustrated in FIG. 2A.
Figure 6:
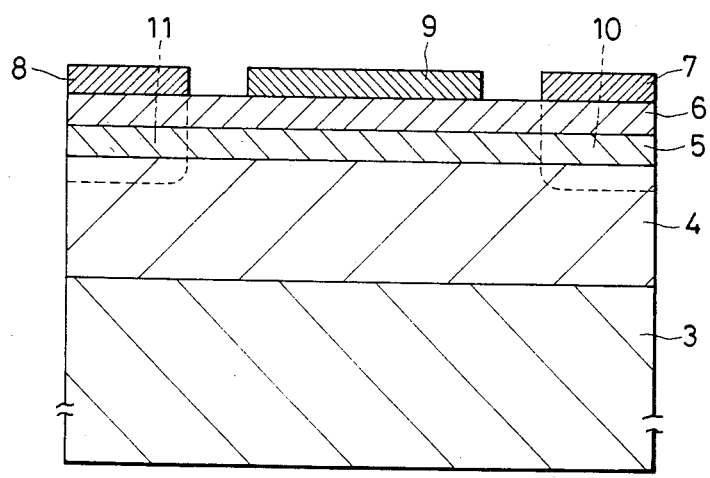

In FIGS. 1A, 1B and 6, the reference numeral 3 denotes a semi-insulative GaAs substrate, 4 a non-doped GaAs layer having no impurity doped therein, 5 an n-type $Al_{0.3}Ga_{0.7}As$ layer, and 6 an n-type GaAs layer having a periodic structure in which a periodic pattern extends in a direction (the direction of the arrow A in FIG. 1A) perpendicular to the source-drain direction (i.e., the channel direction), the n-type GaAs layer 6 in this embodiment being formed so as to define a stripe pattern as illustrated. The portion (I) in which the n-type GaAs layer is formed in FIG. 1A corresponds to the channel region (I) in FIG. 2B, and the poriton (II) in which no n-type GaAs layer is formed corresponds to the barrier region (II). The numerals 10, 11 denote source and drain regions, respectively, 7, 8 source and drain electrodes, respectively, 9 a gate electrode, and 12 a 2-dimensional-electron-gas layer induced near the interface between the GaAs layer 4 and the n-type $Al_{0.3}Ga_{0.7}As$ layer 5.

Figure 4:
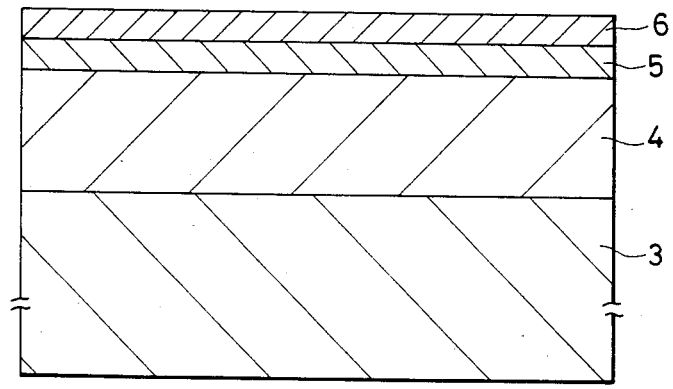
FIGS. 4 to 6 show processes for manufacturing the FET in accordance with the first embodiment of the present invention.

The method of producing this FET will be explained. First, as shown in FIG. 4, a GaAs layer 4 having a thickness of 500 nm is epitaxially grown on a semiinsulative GaAs substrate 3 by molecular beam epitaxy (MBE) in such a manner that no impurity is intentionally doped into the GaAs layer 4 and an n-type $Al_{0.3}Ga_{0.7}As$ layer 5 which contains Si at a concentration of $2\times10^{18}$ cm$^{-3}$ is grown on the layer 4 so as to have a thickness of 30 nm. Further, an n-type GaAs layer 6 which contains Si at a concentration of $2\times10^{18}$ cm$^{-3}$ is grown on the layer 5 so as to have a thickness of 30 nm.

Figure 5:
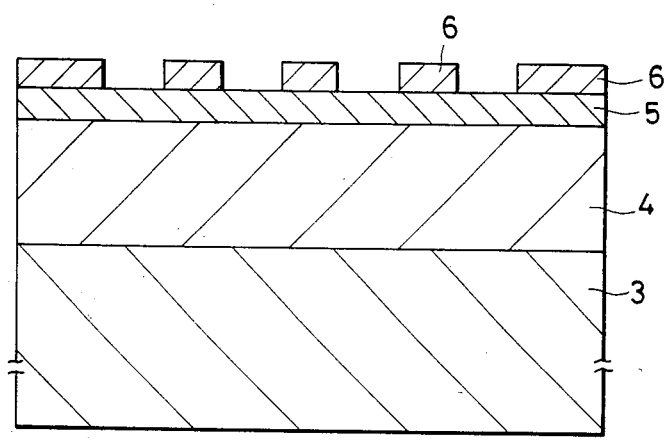

Then, the n-type GaAs layer 6 is processed using electron beam lithography and dry etching in combination so that stripes which have a width of 25 nm, a spacing of 25 nm and a period of 50 nm are formed as schematically shown in FIG. 5. It should be noted that FIGS. 4 and 5 are sectional views of the semiconductor structure as viewed in the same direction as in the case of FIG. 1A.

Then, photoresist is removed using photolithography only from portions at which a source and drain of a field-transistor are to be formed, respectively. Thereafter, Au containing 8% of Ge and having a thickness of 200 nm. Ni having a thickness of 20 nm and Au having a thickness of 200 nm are successively evaporated, and source and drain electrodes 7 and 8 are formed by lift-off as shown in FIG. 6 (it should be noted that the figure is a schematic view and therefore the illustrated film thicknesses are not necessarily coincident with the actual ones).

Further, heating is carried out in a hydrogen ambient at 450° C. for one minute. In consequently impurities are diffused into the layers 4, 5 and 6 from the source and drain electrodes 7 and 8, thus source and drain regions 10 and 11 being formed as shown by the chain line in FIG. 6.

The process for forming the source and drain electrodes 7, 8 and the source and drain regions 10, 11 may be carried out before the process for forming the n-type GaAs layer 6 in the shape of stripes as shown in FIG. 5. In other words, the n-type GaAs layer 6 may be formed after the formation of the source and drain electrodes 7, 8 and the source and drain regions 10, 11.

Then, Ti, Pt and Au respectively having thicknesses of 20 nm, 20 nm and 300 nm are evaporated in a region in which a gate electrode is to be formed by photolithography similar to that used to form the source and drain electrodes 7 and 8, and a gate electrode 9 is formed by lift-off.

In the FET produced as described above, the n-type GaAs layer 6 has a periodic structure defined by regions which are spaced apart from each other in the direction (the direction of the arrow A in FIG. 1A) perpendicular to the source-drain direction (i.e., the channel direction). Accordingly, the density of carriers in the 2-dimensional-electron-gas layer 12 induced near the interface between the CaAs layer 4 and the n-type $Al_{0.3}Ga_{0.7}As$ layer 5 is modulated in accordance with the period of the structure, and the potential felt by these electrons is a periodic potential similar to the potential illustrated in FIG. 2B.

Figure 3:
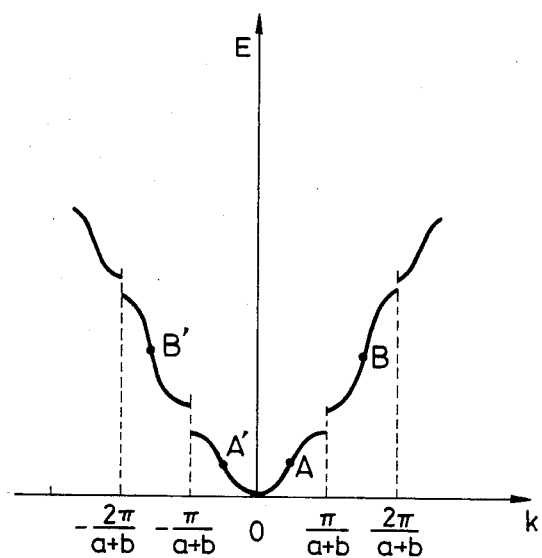
FIG. 3 shows the relationship between the electron energy and wave number in the superlattice semiconductor layers.

In the conventional FET's, electrons induced at the interface between a non-doped GaAs layer and an n-type $Al_{0.3}Ga_{0.7}As$ layer are confined within a relatively deep potential well generated by an electric field applied in a direction perpendicular to the interface and behave as a 2-dimensional-electron gas which moves only within the plane parallel to the interface in a manner similar to that of free electrons. In contrast, in the FET of this embodiment, the periodic potential produced by the periodic structure allows the movement of electrons in the direction of the periodic pattern to be specified by the relationship between the momentum and electron energy shown in FIG. 3.

When the gate voltage is swept in the positive direction, Fermi level gradually rises to reach points of inflexions such as those indicated by A, A', B and B'. As described above, the effective mass of electrons becomes excessively large near these points of inflexions, and the movement of electrons in the direction in which the effective mass increases is stopped, so that the movement of electrons becomes substantially one-dimensional. Thus, it will readily be understood that the mobility of electrons in the channel direction becomes considerably high in the same way as in the case of the quantum well thin line proposed by Sakaki et al.

Figure 7:
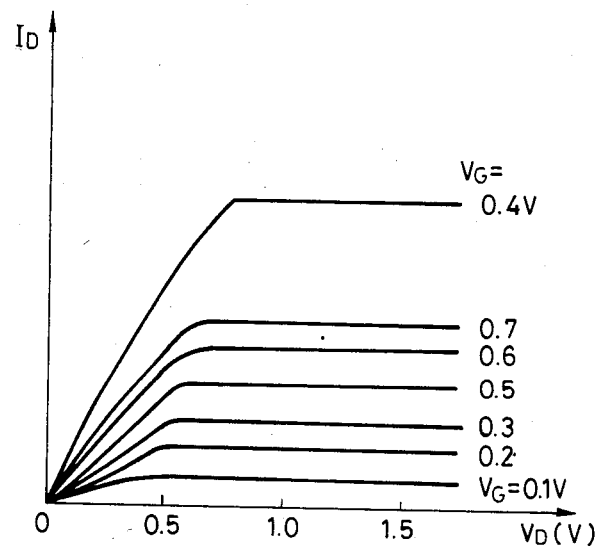
FIG. 7 shows operating characteristics of the FET in accordance with the first embodiment of the present invention.

FIG. 7 exemplifies the operating characteristics of the FET of this embodiment at 4.2° K. The axis of abscissas of the graph represents the drain voltage $V_D$ and the axis of ordinates represents the drain current $I_D$, the graph showing changes in the characteristics occurring when the gate voltage VG is changed. As will be clear from the graph, this fET has the characteristics that the mobility rapidly and the mutual conductance remarkably increase near the gate voltage $V_G=0.4$ V. In general, FET's whose mutual conductance is not a monotone function of the gate voltage are not easy to use. However, when such a FET is used as a bias element near the gate voltage where the mutual conductance significantly increases, it can be used as a transistor having a large gain up to an exceedingly high frequency.

It should be noted that, in the above-described embodiment, metal organic chemical vapor deposition (MO-CVD) may be employed in place of molecular beam epitaxy. When the n-type $Al_{0.3}Ga_{0.7}As$ layer 5 was experimentally replaced with a multilaYer of an undoped $Al_{0.3}Ga_{0.7}As$ layer having a thickness of 6 nm and an n-type $Al_{0.3}Ga_{0.7}As$ layer having a thickness of 24 nm, it was found that the mutual conductance of the FET was further improved and the noise figure was reduced. Further, the n-type $Al_{0.3}Ga_{0.7}As$ layer 5 may effectively be replaced with a thicknesswise superlattice structure of the n-type and having a smaller electron affinity than that of GaAs. Although the description has been made using materials such as GaAs and $Al_{0.3}Ga_{0.7}As$, similar effects can be obtained with other materials which are similar thereto in terms of the relative electron energy.

EMBODIMENT 2

In this embodiment, both semiconductor and conductor layers have periodic structures, respectively.

Figure 8:
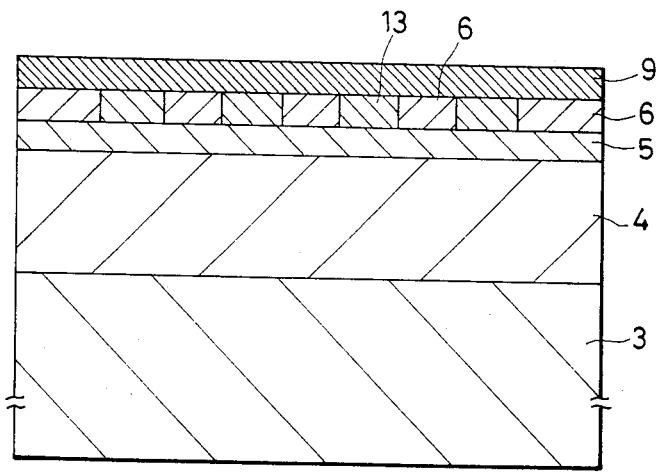
FIG. 8 is a sectional view of a FET in accordance with a second embodiment of the present invention.

FIG. 8 is a sectional view of a FET in accordance with the second embodiment of the present invention, which corresponds to FIG. 1. In the figure, the reference numeral 3 denotes a semi-insulative GaAs substrate, 4 a non-doped GaAs layer having no impurity doped therein, 5 n-type $Al_{0.3}Ga_{0.7}As$ layer, 6 an n-type GaAs layer having a periodic structure in which the periodic pattern extends in a direction perpendicular to the channel direction, 13 Zn-doped regions formed in the n-type GaAs layer 6 so as to have a periodic stripe pattern, and 9 a gate electrode. In this embodiment also, source and drain regions and source and drain electrodes, which are similar to those shown in FIG. 6, are formed in the same way as in the embodiment 1 although these elements are not illustrated. The thickness of each of the layers is the same as in the embodiment 1.

Thus, in this embodiment, a periodic structure is formed by ion implantation of Zn under the condition of $2 \times 10^{12} cm^{-2}$ using a focused beam accelerated to 50 kV so that a stripe pattern having a width of 25 nm, a spacing of 25 nm and a period of 50 nm is formed, whereas, in the embodiment 1, the n-type GaAs layer 6 is formed in the shape of stripes by means of a combination of electron beam lithography and dry etching. In the FET of this embodiment, since both the semiconductor layer 13 and the conductor layer 6 serving as a channel have respective periodic structures, it is possible to greatly improve the mobility of electrons in the channel direction and thus realize a FET of ultrahigh mobility.

Embodiment 3

Figure 9:
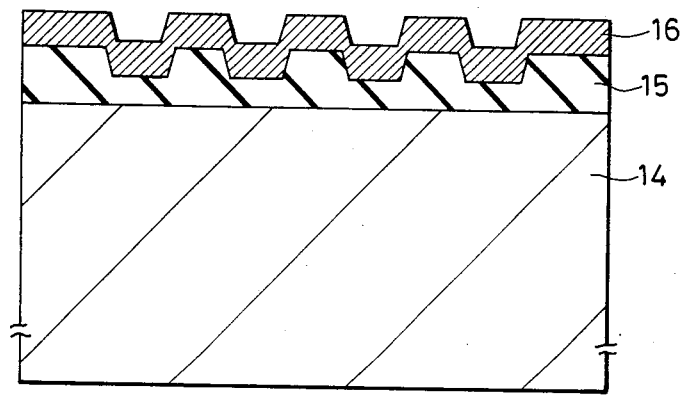
FIG. 9 is a sectional view of a MOSFET in accordance with a third embodiment of the present invention.

In this embodiment, an insulator layer has a periodic structure. FIG. 9 is a sectional view of a MOSFET in accordance with a third embodiment of the present invention, which corresponds to FIG. 1A. In FIG. 9, the reference numeral 14 denotes a Si substrate, 15 a gate insulator film of $SiO_2$ formed in a periodic stripe pattern, and 16 a gate electrode made of Al. The thickness of the striped gate insulator film 15 is set so that thick portions thereof are 30 nm thick and thin portions thereof are 15 nm thick. It should be noted that the source and drain regions and source and drain electrodes are formed as shown in FIG. 6 in the same way as in the embodiment 1. The period in this embodiment is made shorter than those in the embodiments 1 and 2 and set at 20 nm. In the MOSFET of this embodiment also, since the gate insulator film 15 has a periodic structure, it is possible to greatly improve the mobility of electrons in the channel direction and thus realize a MOSFET of ultrahigh mobility. It should be noted that, in this embodiment, advantageous effects have been confirmed with respect to both n- and p-type channels.

Embodiment 4

This embodiment is arranged by completely inverting the conductivity types, that is, the p-type and the n-type. of the constituent elements of the embodiment 2.

Figure 10:
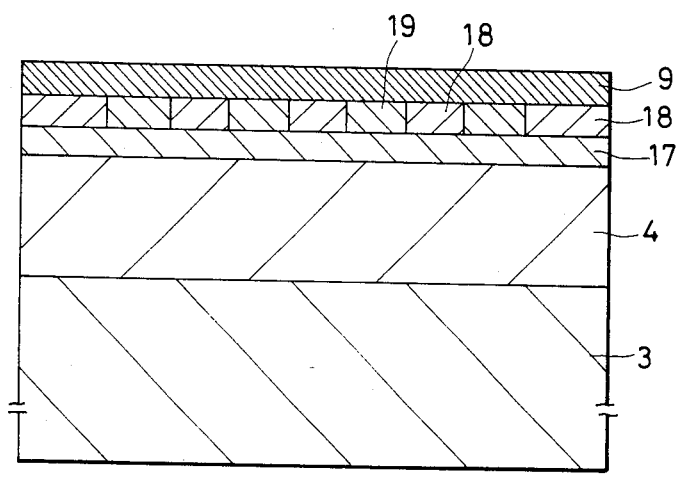
FIG. 10 is a sectional view of a FET in accordance with a fourth embodiment of the present invention.

FIG. 10 is a sectional view of a FET in accordance with the fourth embodiment of the present invention, which corresponds to FIG. 1A. In FIG. 10, the reference numeral 3 denotes a semi-insulative GaAs substrate, 4 a non-doped GaAs layer having no impurity doped therein, 17 a Be-doped p-type $Al_{0.3}Ga_{0.7}As$ layer, 18 a p-type GaAs layer having a periodic structure in which the periodic pattern extends in a direction perpendicular to the channel direction, 19 Si-doped regions formed in the p-type GaAs layer 18 so as to have a periodic stripe pattern, and 9 a gate electrode. In this embodiment also, source and drain regions and source and drain electrodes, which are similar to those shown in FIG. 6, are formed in the same way as in the embodiment 1. The thickness of each of the layers is the same as that of the corrssponding one in the embodiment 1.

Thus, in this embodiment, a periodic structure is formed by ion implantation of Si under the condition of $2 \times 10^{12}$ cm$^{-2}$ using a focused ion beam accelerated to 50 kV so that a stripe pattern having a width of 25 nm, a spacing of 25 nm and a period of 50 nm is formed, whereas, in the embodiment 1, the p-type GaAs layer 18 is formed in the shape of stripes by means of a combination of electron beam lithography and dry etching. Further, this embodiment is arranged by completely inverting the types, that is, the p-type and the n-type of the constuent elements in the embodiment 2. In the FET of this embodiment, which has a periodic structure, it is possible to greatly improve the mobility of holes in the channel direction and thus realize a FET of ultrahigh mobility.

As has been described above, according to the present invention, a periodic structure in which periodic structure elements are periodically disposed in the same direction is formed so as to increase the effective mass of electrons moving in this direction. Thus, the movement of charged particles can be made onedimensional, and this enables a great improvement in the mobility of charged particles in the channel direction. Accordingly, it is possible to realize a FET of ultrahigh mbbility which exceeds the conventional FET's in the working range.

What is claimed is:

1. A semiconductor device comprising:
   a semiconductor substrate;
   first and second respective semiconductor layers formed on said semiconductor substrate, said first and second semiconductor layers forming therebetween aheterojunction and wherein a carrier transfer region is formed adjacent to said heterojunction;
   first and second means for transmitting and receiving carriers and being formed on opposite ends of said carrier transfer region and in contact therewith;
   a third semiconductor layer including a plurality of stripe regions formed on said second semiconductor layer, each of said stripe regions being formed on a portion of said second semiconductor layer with its length in a direction connecting said first and second means and wherein said plurality of stripe regions are parallelly spaced-apart and periodically disposed on said second semiconductor layer in a direction perpendicular to a direction connecting said first and second means; and
   carrier controlling means for controlling the carriers in said carried transfer region, said carrier controlling means being formed on said plurality of stripe regions and on said second semiconductor layer region between respective pairs of stripe regions on a portion of said semiconductor device between said first and second means.

2. A semiconductor device according to claim 1, wherein said plurality of stripe regions are periodically disposed with a period having a range of 5 to 500 nm.

3. A semiconductor device according to claim 2, wherein said period is approximately 50 nm and the width of each stripe region is about 25 nm.

4. A semiconductor device according to claim 2, wherein said carrier controlling means comprises a gate electrode overlying a central portion of said semiconductor device and said first and second means comprise a source and drain region and wherein said semiconductor device is a field-effect transistor of ultrahigh-mobility.

5. A semiconductor device according to claim 4, wherein said semiconductor substrate is comprised of semi-insulating GaAs material, said first layer is of non-doped type GaAs material, said second layer is comprised of n-type $Al_{0.3}Ga_{0.7}As$ material and said third semiconductor layer is comprised of n-type GaAs material which contains Si.

6. A semiconductor device according to claim 5, wherein said Si has a doping concentration of about $2 \times 10^{18}$ cm$^{-3}$ and wherein each of said plurality of stripe regions having a thickness of about 30 nm, a width of about 25 nm and are periodically on said second semiconductor layer about every 50 nm.

7. A semiconductor device according to claim 5, wherein respective channels between the source and drain are formed in those portions of said semiconductor device having said stripe regions and in those portions having no stripe layers a barrier region is formed, and wherein said carrier transfer region comprises a two-dimensional-electron-gas layer having a density of carriers, induced near the interface of said GaAs layer and said Al$_{0.3}$Ga$_{0.7}$As layer, which is modulated in accordance with the period of said plurality of stripe regions thereby resulting in substantial electron flow movement only in the direction of a respective channel.

8. A semiconductor device comprising:
a semiconductor substrate;
first and second respective semiconductor layers formed on said semiconductor substrate, said first and second semiconductor layers forming therebetween a heterojunction and wherein a carrier transfer region is formed adjacent to said heterojunction;
first and second means for transmitting and receiving carriers and being formed on opposite ends of said carrier transfer region and in contact therewith;
a third semiconductor layer including a plurality of stripe regions formed on said second semiconductor layer, each region being formed on a portion of said second semiconductor layer with its length in a direction connecting said first and second means and wherein said plurality of stripe regions are parallelly and periodically disposed on said second semiconductor layer in a direction perpendicular to a direction connecting said first and second means forming a pattern of stripe regions having a periodic structure and of a material and doping concentration such that there results a substantial charge flow movement only in the direction along the length of the respective stripe regions and on the portions wherein the stripe regions are formed; and
carrier controlling means for controlling the carriers in said carrier transfer region, said carrier controlling means being formed on said third semiconductor layer on a portion thereof between said first and second means.

9. A semiconductor device according to claim 8, wherein said plurality of stripe regions are parallelly spaced-apart and periodically disposed on said second semiconductor layer in a direction perpendicular to a direction connecting said first and second means; and said carrier controlling means being formed on both said plurality of stripe regions and on said second semiconductor layer between respective pairs of stripe regions on a portion of said semiconductor device between said first and second means.

10. A semiconductor device according to claim 9, wherein said carrier controlling means comprises a gate electrode overlying a central portion of said semiconductor device and said first and second means comprise a source and drain region and wherein said semiconductor device is a field-effect transistor of ultrahigh-mobility.

11. A semiconductor device according to claim 8, wherein said plurality of stripe regions are periodically disposed with a period having a range of 5 to 500 nm.

12. A semiconductor device according to claim 8, wherein said plurality of stripe regions are comprised of a first group of stripe regions of a first type of layer and a second group of stripe regions having a different doping characteristic than said first group is formed in said first type of layer, said first and second groups being a parallelly disposed alternating planar arrangement wherein a stripe region of one group is disposed between and contiguous with a pair of stripe regions of the other group.

13. A semiconductor device according to claim 12, wherein said carrier controlling means comprises a gate electrode overlying a central portion of said semiconductor device and said first and second means comprise a source and drain region and wherein said semiconductor device is a field-effect transistor of ultrahigh-mobility.

14. A semiconductor device according to claim 13, wherein said first type of layer is comprised of a GaAs layer and said second group is comprised of Zn-doped regions periodically formed in said GaAs layer such that there results in a periodic arrangement of alternating stripe regions.

15. A semiconductor device according to claim 14, wherein said Zn-doped regions are formed by ion implantation.

16. A semiconductor device according to claim 14, wherein said period is approximately 50 nm and the width of each stripe region is about 25 nm.

17. A semiconductor device comprising:
a semiconductor substrate;
first and second respective semiconductor layers formed on said semiconductor substrate, said first and second semiconductor layers forming therebetween a heterojunction and wherein a carrier transfer region is formed adjacent to said heterojunction;
first and second means for transmitting and receiving carriers and being formed on opposite ends of said carrier transfer region and in contact therewith;
a third semiconductor layer formed on said second semiconductor layer including a plurality of stripe regions forming a periodic planar pattern structure comprised of a first group of stripe regions of a first type of layer and a second group of stripe regions having a different doping characteristic than said first group formed on said first type of layer, said first and second groups of stripe regions being a parallelly disposed alternating arrangement of strip regions of said second group periodically formed on said first type of layer thereby effecting a periodic planar pattern structure of a stripe region of one group disposed between a pair of stripe regions of the other group, and wherein each of said plurality of regions is formed such that its length is in a direction connecting said first and second means thereby effecting in a channel therethrough and said parallelly disposed alternating arrangement is in a direction perpendicular to a direction connecting said first and second means; and
carrier controlling means for controlling the carriers in said carrier transfer region, said carrier controlling means being formed on said third semiconductor layer on a portion thereof between said first and second means.

18. A semiconductor device according to claim 17, wherein said plurality of stripe regions are periodically disposed with a period having a range of 5 to 500 nm.

19. A semiconductor device according to claim 18, wherein said carrier controlling means comprises a gate electrode overlying a central portion of said semiconductor device and said first and second means comprise a source and drain region and wherein said semiconductor device is a field-effect transistor of ultrahigh-mobility.

20. A semiconductor device according to claim 19, wherein said first type of layer is comprised of a GaAs layer and said second group is comprised of Zn-doped regions periodically formed in said GaAs layer such that there results in a periodic arrangement of alternating stripe regions.

21. A semiconductor device according to claim 20, wherein said Zn-doped regions are formed by ion implantation.

22. A semiconductor device according to claim 26, wherein said semiconductor substrate is comprised of semi-insulating GaAs material, said first layer is of non-doped type GaAs material, said second layer is comprised of n-type $Al_{0.3}Ga_{0.7}As$ material and said third semiconductor layer is comprised of n-type GaAs material which contains Zn periodically disposed for forming said first and second groups of stripe regions.

23. A semiconductor device according to claim 19, wherein said semiconductor substrate is comprised of semi-insulating GaAs material, said first layer is of non-doped type GaAs material, said second layer is comprised of Be-doped p-type $Al_{0.3}Ga_{0.7}As$ material and said third semiconductor layer is comprised of p-type GaAs material which contains Si periodically disposed for forming said first and second groups of stripe regions.

24. A semiconductor device according to claim 23, wherein said period is approximately 50 nm and the width of each stripe region is about 25 nm.

25. A semiconductor device according to claim 22, wherein said period is approximately 50 nm and the width of each stripe region is about 25 nm.

26. A semiconductor device comprising:
a semiconductor region;
an insulating layer formed on said semiconductor region, and a carrier transfer region is formed adjacent to an interface between said semiconductor region and said insulating layer;
first and second means for transmitting and receiving carriers and being formed on opposite ends of said carrier transfer region and in contact therewith;
said insulating layer being comprised of a plurality of stripe regions formed on said insulating layer each being spaced apart and having a thickness greater than the thickness of the insulating layer between each pair of said stripe regions and wherein each stripe region is formed so that its length is disposed in a direction connecting said first and second means and said plurality of stripe regions are parallelly spaced-apart and periodically disposed in a direction perpendicular to a direction connecting said first and second means; and
carrier controlling means for controlling the carriers in said carrier transfer region, said carrier controlling means being formed on said plurality of stripe regions and on the insulating layer between pairs of stripe regions on a portion of said semiconductor device between said first and second means.

27. A semiconductor device according to claim 26, wherein said plurality of stripe regions are periodically disposed with a period having a range of 5 to 500 nm.

28. A semiconductor device according to claim 26, wherein said carrier controlling means comprises a gate electrode overlying a central portion of said insulating layer and said first and second means comprise a source and drain region and wherein said semiconductor device is a MOSFET of ultrahigh-mobility.

29. A semiconductor device according to claim 28, wherein said MOSFET is of the n-channel type, the resulting channel formed being in a direction parallel to the length of the respective stripe regions and whereby greater directional mobility control results.

30. A semiconductor device according to claim 28, wherein said MOSFET is of the p-channel type, the resulting channel formed being in a direction parallel to the length of the respective stripe regions and whereby greater directional mobility control results.

31. A semiconductor device according to claim 28, wherein said insulating layer is comprised of an insulator film in the form of substantially rectangular notches in which the thick portions corresponding to said stripe regions are about 30 nm thick and the thin portions are about 15 nm thick, and wherein the period of the parallel arrangement of said plurality of stripe regions is about 20 nm.

* * * * *